(12) United States Patent
Mochida

(10) Patent No.: US 8,693,278 B2
(45) Date of Patent: Apr. 8, 2014

(54) SEMICONDUCTOR DEVICE AND DATA PROCESSING SYSTEM

(76) Inventor: Noriaki Mochida, Tokyo (JP)

(*) Notice: Subject to any disclaimer, the term of this patent is extended or adjusted under 35 U.S.C. 154(b) by 70 days.

(21) Appl. No.: 13/414,152

(22) Filed: Mar. 7, 2012

(65) Prior Publication Data

US 2012/0230141 A1 Sep. 13, 2012

(30) Foreign Application Priority Data

Mar. 8, 2011 (JP) ................... 2011-050853

(51) Int. Cl.
*G11C 8/00* (2006.01)
*G11C 8/10* (2006.01)
*G11C 16/24* (2006.01)

(52) U.S. Cl.
CPC . *G11C 8/10* (2013.01); *G11C 16/24* (2013.01)
USPC ............... 365/230.06; 365/51; 365/185.11; 365/185.13; 365/185.23

(58) Field of Classification Search
CPC ............ G11C 16/24; G11C 11/4094; G11C 13/0026; G11C 2213/71; G11C 8/12; H01L 27/2409
USPC ........ 365/185.11, 185.13, 185.23, 230.06, 51
See application file for complete search history.

(56) References Cited

U.S. PATENT DOCUMENTS

| 5,612,919 A | 3/1997 | Arimoto |
| 5,831,921 A | 11/1998 | Tsukude |
| 2011/0026348 A1* | 2/2011 | Narui ................... 365/210.1 |

FOREIGN PATENT DOCUMENTS

| JP | 8-195100 A | 7/1996 |
| JP | 9-161477 A | 6/1997 |

\* cited by examiner

*Primary Examiner* — Thong Q Le
(74) *Attorney, Agent, or Firm* — Sughrue Mion, PLLC

(57) ABSTRACT

Disclosed herein is a semiconductor device comprising local bit lines, a global bit line, local switch control lines, main switch control lines, hierarchical switches controlling electrical connections between the local bit lines and the global bit line in response to potentials of the local switch control lines, local switch drivers driving the local switch control lines in response to potentials of the main switch control lines, and main switch drivers selectively activating the main switch control lines.

27 Claims, 13 Drawing Sheets

20: CONTROL SIGNAL GENERATION CIRCUIT

30: CONTROL SIGNAL GENERATION CIRCUIT

SEMICONDUCTOR DEVICE AND DATA PROCESSING SYSTEM

BACKGROUND OF THE INVENTION

1. Field of the Invention

The present invention relates to a semiconductor device comprising a memory cell array having a hierarchical bit line structure and a hierarchical word line structure.

2. Description of Related Art

In semiconductor memory devices of recent years such as a DRAM, an increase in capacity and a reduction in size have been achieved, and an increase in the number of memory cells on a bit line causes that a bit-line capacitance tends to increase. Therefore, in order to deal with this performance problem, a hierarchical memory cell array including global bit lines and local bit lines has been employed. In this kind of the hierarchical memory cell array, a plurality of local bit lines are arranged corresponding to each one of global bit lines via a plurality of hierarchical switches, and thereby shortening the length of each local bit line on which a plurality of memory cells are arranged. Further, the hierarchical switches controlling electrical connections between the global bit line and each of the local bit lines enable to read out data stored in a selected memory cell to a local bit line so that the read data can be transmitted to the global bit line through a hierarchical switch. Furthermore, when employing a hierarchical word line structure in addition to a hierarchical bit line structure, a plurality of sub-word lines are arranged corresponding to each one of main word lines via a plurality of sub-word drivers, and thereby shortening the length of each sub-word line. A plurality of memory cells are arranged on each sub-word line. A so-called cross-point cell between a word line and a bit line is defined by a memory cell that is connected to each sub-word line and each local bit line. For example, specific examples of the hierarchical bit line structure or the hierarchical word line structure are disclosed in Patent References 1 and 2.

[Patent Reference 1] Japanese Patent Application Laid-open No. H8-195100 (U.S. Pat. No. 5,612,919)
[Patent Reference 2] Japanese Patent Application Laid-open No. H9-161477 (U.S. Pat. No. 5,831,921)

If the memory cell array becomes large in size, connections of the plurality of hierarchical switches need to be controlled by switch control lines. An increase in the number of the hierarchical switches with an increase in size of the hierarchical memory cell array causes load of the switch control liens to increase, and thereby timing controls to electrically connect between the local bit lines and the global bit line need to be performed differently from one part to another. This is due to that parasitic resistance and capacitance of the switch control lines increase so that time constants thereof increase. There is a skew between access timing of the local and global bit lines and control timing of the hierarchical switches, thereby decreasing access speed. Further, the hierarchical word line structure causes increases in circuit scales of sub-word drivers for driving the sub-word lines and main word drivers for driving the main word lines. In this manner, when employing the hierarchical memory cell array, circuits associated with hierarchization cause an increase in chip size.

SUMMARY

A semiconductor device according to an embodiment of the disclosure comprises: a plurality of first local bit lines; a first global bit line corresponding to the first local bit lines, the first global bit line being longer in length than the first local bit lines; a plurality of first local switch control lines; a plurality of main switch control lines corresponding to the first local switch control lines, the main switch control lines being respectively longer in length than the first local switch control lines; a plurality of first hierarchical switches respectively controlling electrical connections between the first local bit lines and the first global bit line in response to potentials of the first local switch control lines; a plurality of first local switch drivers respectively driving the first local switch control lines in response to potentials of the main switch control lines; and a plurality of main switch drivers respectively activating the main switch control lines selectively.

DETAILED DESCRIPTION OF THE PREFERRED EMBODIMENTS

It is apparent that the present invention is not limited to embodiments described below, but should be construed based on the disclosure of the claims.

Figure 1:
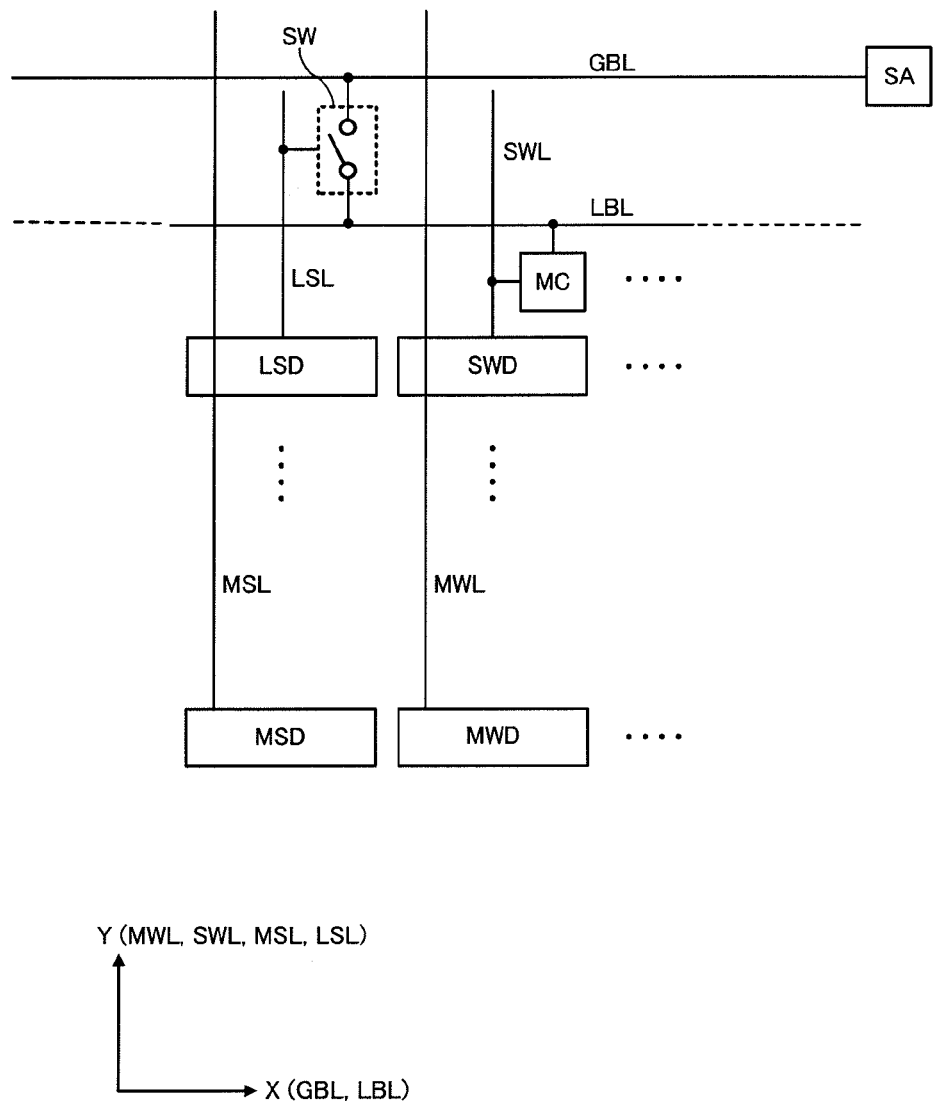
FIG. 1 is a diagram showing an embodiment of the invention.

As shown in FIG. 1, an embodiment of the invention is a semiconductor device comprising a memory cell array having at least a hierarchical bit line structure. The semiconductor device of FIG. 1 has the bit line structure hierarchized into a global bit line GBL and local bit lines LBL. X and Y directions perpendicular to each other are shown with arrows for convenience in a lower part of FIG. 1. The X direction is parallel to an extending direction of the global bit line GBL and the local bit lines LBL, and the Y direction is parallel to an extending direction of a main word line MWL, a sub-word line SWL, a main switch control line MSL, and a local switch control line LSL.

FIG. 1 shows one global bit line GBL and one local bit line LBL. However, practically, a plurality of global bit lines GBL are arranged in the Y direction. A plurality of local bit lines LBL partitioned along the X direction are arranged with respect to the one global bit line GBL. Each of the global bit lines GBL and the local bit lines LBL extends in the X direction. The length of each local bit line LBL is shorter than the length of the global bit line GBL. A plurality of memory cells MC are coupled to each local bit line LBL. Hereinafter, a range including one of the local bit lines LBL will be described. However, other local bit lines LBL have the same structure.

In FIG. 1, the local switch control line LSL and the main switch control line MSL corresponding to the local switch control line LSL are further arranged, and there is provided a hierarchical switch SW controlling an electrical connection between the local bit line LBL and the global bit line GBL in response to a potential of the local switch control line LSL. There are further provided a local switch driver LSD that drives the switch control line LSL in response to a potential of the main switch control line MSL, and a main switch driver MSD that selectively activates the main switch control line MSL. The local switch driver LSD drives a plurality of hierarchical switches SW respectively corresponding to the local bit lines LBL adjacent in the Y direction. The number of the hierarchical switches SW will be described later.

Meanwhile, when employing the hierarchical word line structure in addition to the bit line structure, a plurality of memory cells MC coupled to the local bit line LBL, a sub-word line SWL that selects each memory cell MC and a main word line MWL corresponding to the sub-word line SWL can be arranged. In this case, a sub-word driver SWD that selectively activates the sub-word line SWL in response to a potential of the main word line MWL, and a main word driver MWD that selectively activates the main word line MWL may be further provided. Furthermore, there may be provided a sense amplifier SA that amplifies a signal voltage of the global bit line GBL. The number of hierarchical switches SW driven by one local switch driver LSD is equal to the number of memory cells MC corresponding to a plurality of local bit lines LBL adjacent in the Y direction that is driven by one sub-word driver SWD. In other words, each local switch control line LSL extending in the Y direction has a length approximately equal to that of each sub-word line SWL extending in the Y direction. One local switch driver LSD and a plurality of sub-word drivers SWD are aligned and extend in the X direction. Each main switch control line MSL drives a plurality of local switch drivers LSD aligned in the Y direction. The main switch control line MSL and the local switch control line LSL extend in the Y direction. Each local switch control line LSL has a length shorter than that of each main switch control line MSL. Each main switch driver MSD drives a plurality of local switch drivers LSD aligned in the Y direction. The number of local switch drivers LSD driven by one main switch driver MSD is equal to the number of sub-word drivers SWD aligned in the Y direction that is driven by the main word driver MWD. Each main switch control line MSL extending in the Y direction has a length approximately equal to that of each main word line MWL extending in the Y direction. One main switch driver MSD and a plurality of main word drivers MWD are aligned and extend in the X direction.

By employing the configuration of FIG. 1, when controlling a connection state of each hierarchical switch SW in the hierarchical bit line structure, the local switch drivers LSD and the main switch driver MSD can be configured in a small scale, and can be arranged in a space along the local switch control lines LSL and the main switch control line MSL so that no extra layout area is needed. Further, it is possible to effectively prevent a decrease in access speed due to timing skew or the like that becomes a problem in the hierarchical bit line structure by arranging main switch drivers MSD in an X decoder region (a lower part of FIG. 1) so as to easily perform timing control.

Further embodiments will be described in the followings. In the following embodiments, the present invention is applied to a DRAM (Dynamic Random Access Memory) as an example of the semiconductor device having the hierarchical bit line structure.

First Embodiment

Figure 2:
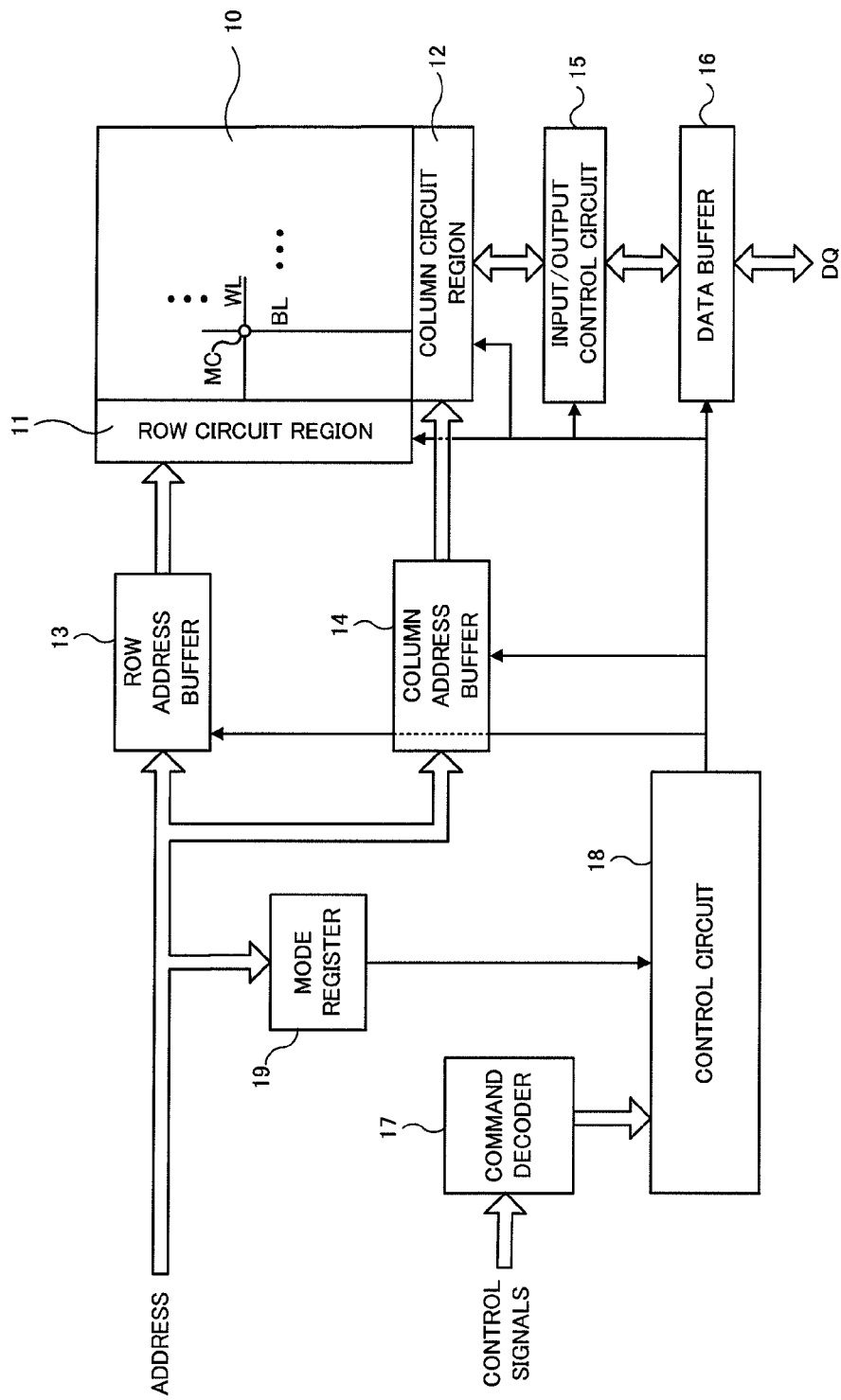
FIG. 2 is a block diagram showing an entire configuration of a DRAM of a first embodiment.

A DRAM of a first embodiment will be described below. FIG. 2 is a block diagram showing an entire configuration of the DRAM of the first embodiment. In the DRAM shown in FIG. 2, there are provided an array region 10 including a large number of memory cells MC arranged at intersections of a plurality of word lines WL and a plurality of bit lines BL, and row circuits 11 and column circuits 12 that are attached to the array region 10. As described later, the bit lines BL in the array region 10 are hierarchized into global bit lines GBL of an upper hierarchy and local bit lines LBL of a lower hierarchy. The word lines WL in the array region 10 are hierarchized into main word lines MWL of an upper hierarchy and sub-word lines SWL of a lower hierarchy. The row circuits 11 includes a plurality of circuits provided corresponding to the plurality of word lines WL, and the column circuits 12 includes a plurality of circuits provided corresponding to the plurality of bit lines BL.

An externally received address includes a row address and a column address. The row address is stored in a row address buffer 13 and sent to the row circuits 11. The column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ). A command decoder 17 determines a command for the DRAM based on externally received control signals and sends the command to a control circuit 18. The control circuit 18 controls operations of respective parts of the DRAM in accordance with a command type determined by the command decoder 17, by which operations of the array region 10 and its peripheral circuits are controlled. A mode register 19 selectively sets operation modes of the DRAM based on the above address and sends setting information to the control circuit 18.

Figure 3:
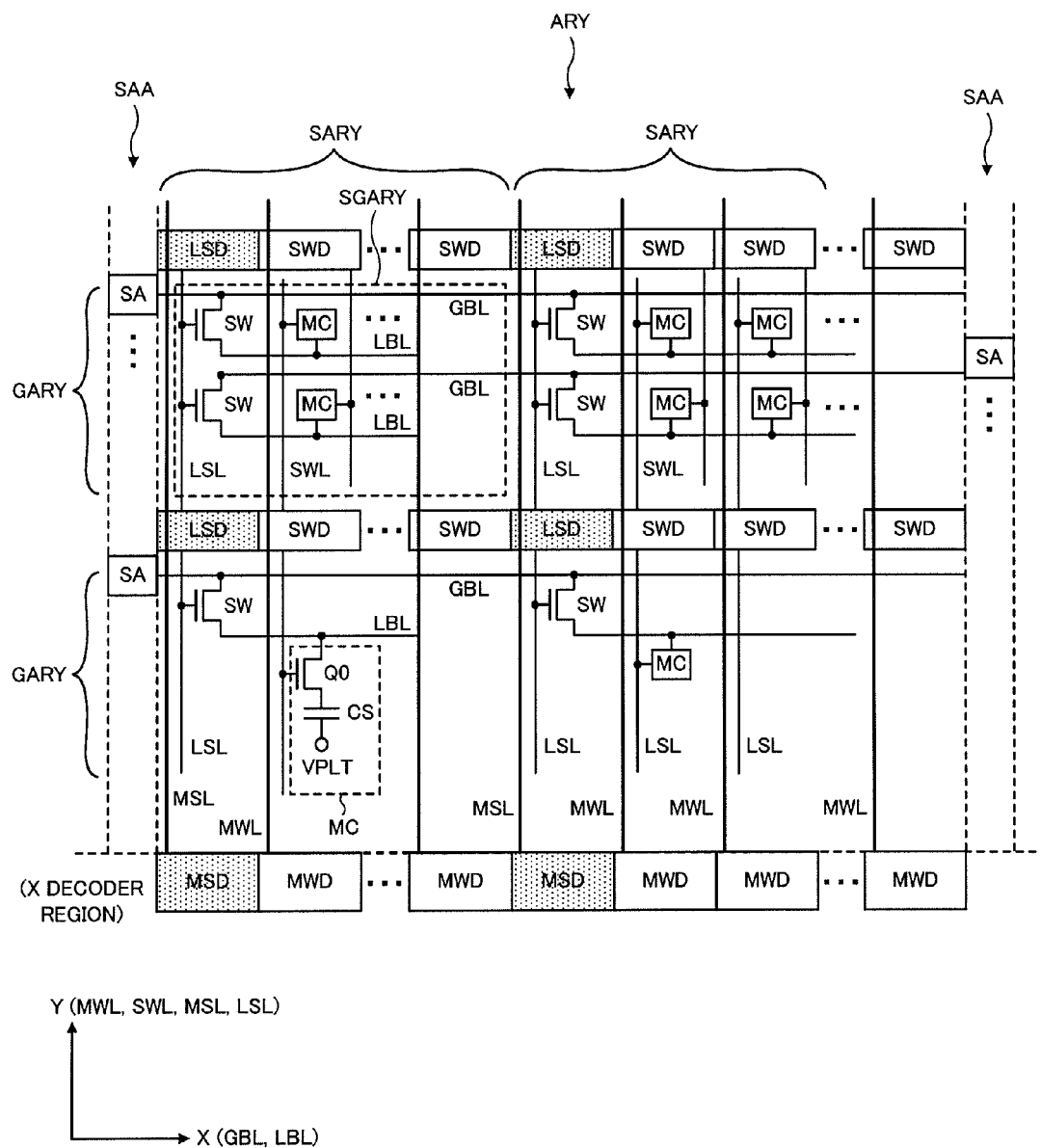
FIG. 3 is a diagram showing a configuration of a principal part of the DRAM of the first embodiment.

Next, FIG. 3 shows a configuration of a principal part of the DRAM of the first embodiment. The configuration of FIG. 3 includes a memory cell array ARY as a unit area in the array region 10, and circuits in an X decoder region adjacent to the array region 10. In addition, the X and Y directions are shown with arrows in the lower part of FIG. 3, which have the same meaning as in FIG. 1.

As described above, the memory cell array ARY has the bit line structure hierarchized into the global bit lines GBL and the local bit lines LBL. Sense amplifier arrays SAA each including a plurality of sense amplifiers SA are arranged on both sides of the memory cell array ARY. The global bit lines GBL arranged in the memory cell array ARY are alternately connected to the sense amplifiers SA of the sense amplifier arrays SAA on both sides (zigzag arrangement). In addition, the memory cell array ARY shown in FIG. 3 has an open bit line structure.

Each sense amplifier SA amplifies a signal voltage transmitted through the global bit line GBL and outputs a binary determination result. Further, each sense amplifier SA includes a precharge circuit that precharges the global bit line GBL to a predetermined precharge potential. Each local bit line LBL can also be precharged through the hierarchical switch SW by the precharge circuit in the sense amplifier SA, in addition to precharging the global bit line GBL.

For example, M local bit lines LBL segmented along the X direction are arranged corresponding to each one of the global bit lines GBL. In this case, a unit area segmented by the local bit lines LBL forms one sub-array SARY. Meanwhile, L global bit lines GBL are arranged adjacently in the Y direction in the memory cell array ARY. Thus, in a configuration in which the M local bit lines LBL correspond to each one of the global bit lines GBL, M×L local bit lines LBL are arranged in the memory cell array ARY, and M sub-arrays SARY are aligned in the X direction.

In the memory cell array ARY, for example, 16 local bit lines LBL (16 sub-arrays SARY) are arranged corresponding to each one of the global bit lines GBL. In this case, the length of each local bit line LBL is one sixteenth of the length of the global bit line GBL. A wiring layer of the global bit lines GBL is normally formed over a wiring layer of the local bit lines LBL in a multiple layer structure of the DRAM. For example, the global bit lines GBL can be formed of low-resistance metal in an upper layer, and the local bit lines LBL can be formed as embedded bit lines in a lower high-resistance diffusion layer. When employing such a structure, it is possible to suppress wiring resistance by shorting the length of the local bit lines LBL.

Further, the hierarchical word line structure of the memory cell array ARY includes main word lines MWL and sub-word lines SWL extending in the Y direction respectively. One end of each main word line MWL is connected to a main word driver MWD in the X decoder region and the main word line MWL is connected to a plurality of sub-word drivers SWD in the memory cell array ARY. The plurality of sub-word drivers SWD are aligned in the Y direction with a constant interval. For example, each main word line MWL is connected to eight sub-word drivers SWD aligned in the Y direction, and two sub-word lines SWL extending in opposite directions are connected to each of the sub-word drivers SWD. That is, the respective sub-word lines SWL are alternately connected to sub-word drivers SWD adjacent on both sides in the Y direction (zigzag arrangement).

For example, N sub-word lines SWL segmented along the Y direction are arranged corresponding to each one of the main word lines MWL. In this case, a unit area segmented by the sub-word lines SWL forms one group array GARY. Meanwhile, P main word lines MWL are arranged adjacently in the X direction in the memory cell array ARY. Thus, in a configuration in which the N sub-word lines SWL correspond to each one of the main word lines MWL, N×P sub-word lines SWL are arranged in the memory cell array ARY, and N group arrays GARY are aligned in the Y direction.

The memory cell array ARY includes a plurality of segment arrays SGARY. Each segment array SGARY is represented as an intersection area of one sub-array SARY and one group array GARY. In other words, when forming a set including a first number of sub-word drivers SWD and corresponding local switch drivers LSD, the set defines M segments. One segment array SGARY is defined between two sets aligned in the Y direction. The local switch drivers LSD will be described later.

A plurality of memory cells MC formed at intersections of the local bit lines LBL and the sub-word lines SWL are arranged in the memory cell array ARY. A main word driver MWD and a sub-word driver SWD are selectively activated in accordance with the row address in the memory cell array ARY so that a corresponding memory cell MC can be selected. Each memory cell MC is composed of a selection transistor Q0 that is selectively switched by the sub-word line SWL and a capacitor CS that stores data as electric charge of a data storage node SN, and a plate voltage VPLT is supplied to the capacitor CS.

Further, the hierarchical structure of switch control lines of the memory cell array ARY includes main switch control lines MSL and local switch control lines LSL extending in the Y direction respectively. One end of each main switch control line MSL is connected to a main switch driver MSD in the X decoder region and the main switch control line MSL is connected to a plurality of local switch drivers LSD in the memory cell array ARY. The plurality of local switch drivers LSD are aligned in the Y direction with a constant interval. For example, each main switch control line MSL is connected to eight local switch drivers LSD aligned in the Y direction, and one local switch control line LSL is connected to each local switch driver LSD.

Hierarchical switches SW provided at one ends of the respective local bit lines LBL are connected to each local switch control line LSL. Each hierarchical switch SW is composed of one NMOS transistor that controls an electrical connection between the local bit line LBL and the global bit line GBL in response to the potential of the local switch control line LSL applied to its gate. In the configuration of FIG. 3, the hierarchical switches SW whose number is the same as that of the local bit lines LBL in the memory cell array ARY are assumed to be arranged. In addition, the number of the local switch drivers LSD is desired to be the same as the number of the sub-word drivers SWD in the Y direction (eight for each drivers in FIG. 1).

Figure 4:
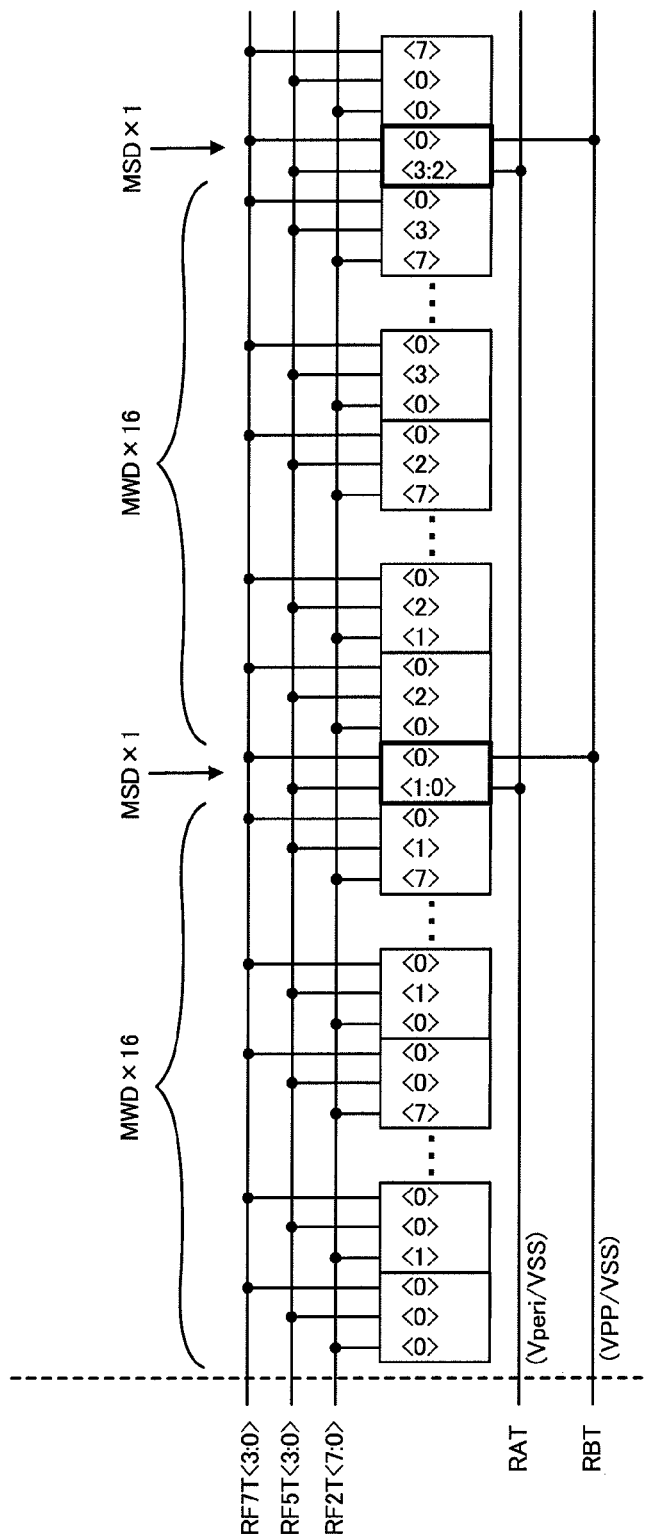
FIG. 4 is a block diagram schematically showing an arrangement of main word drivers and main switch drivers and a configuration of control lines in an X decoder region of the first embodiment.

Next, FIG. 4 is a block diagram schematically showing an arrangement of the main word drivers MWD and the main switch drivers MSD and a configuration of control lines in the X decoder region of FIG. 3. As shown in FIG. 4, a driver group corresponding to one sub-array SARY includes 16 main word drivers MWD aligned in the X direction and one main switch driver MSD. Thus, a plurality of driver groups corresponding to the number of sub-arrays SARY are repeatedly arranged in the X decoder region. Further, in the X decoder region, there are arranged lines of decode signal groups RF7T, RF5T and RF2T supplied to the main word drivers MWD and the main switch drivers MSD, and control signals RAT and RBT supplied to the main switch drivers MSD.

The decode signal groups RF7T, RF5T and RF2T are respectively generated by an X decoder circuit in accordance with constituent bits of the row address. The decode signal group RF7T includes four decode signals RF7T<3:0>, the decode signal group RF5T includes four decode signals RF5T<3:0>, and the decode signal group RF2T includes eight decode signals RF2T<7:0>. Lines of different combinations of the decode signal groups RF7T, RF5T and RF2T are connected to the main word drivers MWD and the main switch drivers MSD, respectively.

For example, combinations of the decode signal groups RF7T, RF5T and RF2T that are supplied to main word drivers MWD in a driver group at a left end of FIG. 4 include eight combinations of decode signals RF7T<0>, RF5T<0> and RF2T<0> to RF2T<7> and eight combinations of decode signals RF7T<0>, RF5T<1> and RF2T<0> to RF2T<7>. The decode signal groups RF7T and RF5T for other driver groups sequentially increase in bit number. In this manner, one main word driver MWD conforming to the row address can be selected.

Meanwhile, the control signals RAT and RBT are generated by a later-described control signal generation circuit in a peripheral circuit region. Lines of the control signals RAT and RBT are connected to the main switch drivers MSD each included in a driver group as a unit. The control signals RAT and RBT have a function of generating a desired reset timing given to corresponding hierarchical switches SW through the main switch driver MSD and the local switch drivers LSD, which will be described in detail later.

Figure 5A:
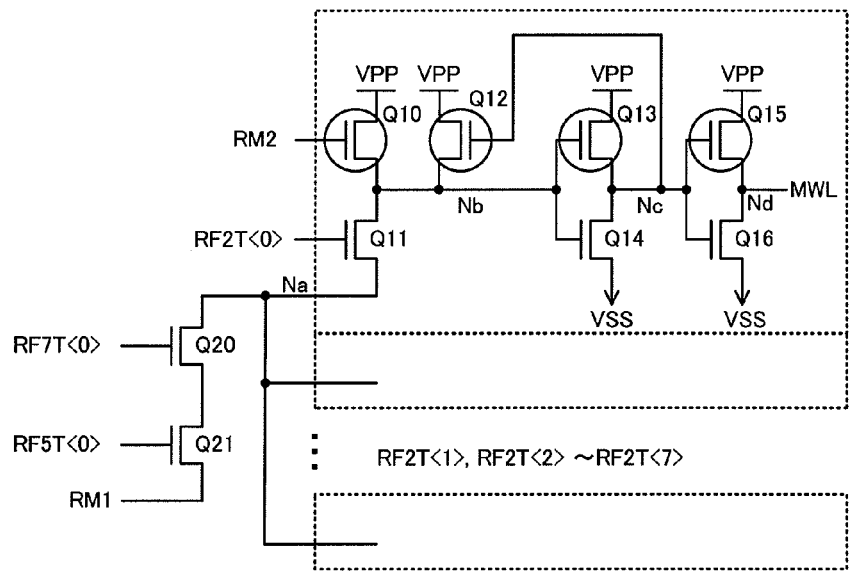
FIGS. 5A and 5B are diagrams showing circuit configurations of a main word driver and a main switch driver in the X decoder region of the first embodiment.
Figure 5B:
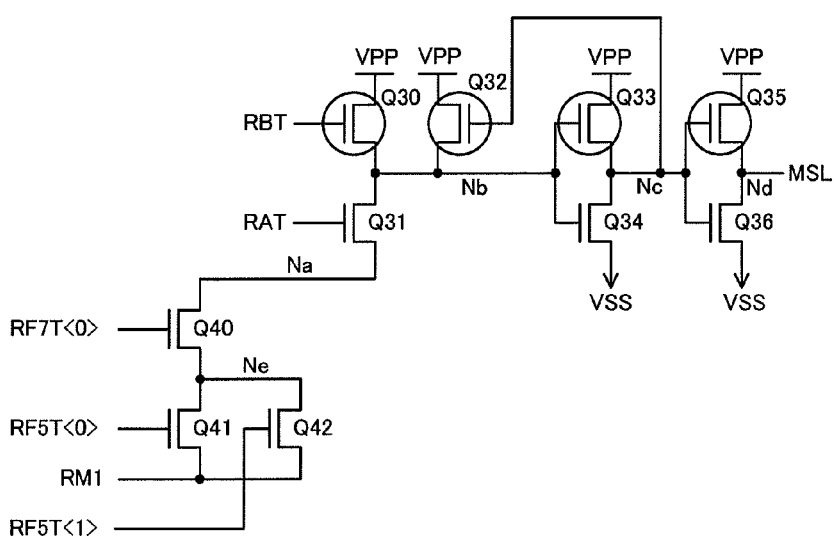

Next, configurations and operations of the main word driver MWD and the main switch driver MSD in FIGS. 3 and 4 will be described. FIG. 5A shows a circuit configuration of the main word driver MWD, and FIG. 5B shows a circuit configuration of the main switch driver MSD. FIG. 5A includes eight adjacent main word drivers MWD (for example, eight main word drivers MWD at the left end of FIG. 4), and there are provided transistors Q10 to Q16 included in each main word driver MWD and transistors Q20 and Q21 commonly used in the eight main word drivers MWD.

A main word driver MWD at an uppermost part of FIG. 5A includes a three-stage inverter circuit composed of pairs of PMOS and NMOS type transistors. That is, a first stage inverter is composed of a pair of transistors Q10 (PMOS) and Q11 (NMOS), a second stage inverter is composed of a pair of transistors Q13 (PMOS) and Q14 (NMOS), and a last stage inverter is composed of a pair of transistors Q15 (PMOS) and Q16 (NMOS). The first stage inverter is connected between a positive potential VPP and a node Na, and the second and last inverters are connected between the positive potential VPP and a ground potential VSS. Further, the PMOS type transistor Q12 is connected between the positive potential VPP and an output node Nb of the first stage inverter (an input node of the second stage inverter), and has a gate connected to an output node Nc of the second stage inverter (an input node of the last stage inverter). An output node Nd of the last stage inverter is connected to the main word line MWL. In addition, high-voltage transistors are used as the transistors Q10 to Q16, and a description thereof will be omitted.

In a circuit portion at an input side of FIG. 5A, the decode signal RF7T<0> is applied to a gate of the transistor Q20, the decode signal RF5T<0> is applied to a gate of the transistor Q21, and a control signal RM1 is applied to a source of the transistor Q21. Further, a source of the transistor Q20 is connected to respective nodes Na of the eight main word drivers MWD. When both the decode signals RF7T<0> and RF5T<0> are at a high level and the control signal RM1 is at a low level, a pair of transistors Q20 and Q21 turn on so that a potential of a low level is applied to a source of the transistor Q11 (node Na) of each main word driver MWD. Here, both the control signals RM1 and RM2 are generated in the peripheral circuit region.

The control signal RM2 is applied to a gate of the transistor Q10, and the decode signal RF2T<0> is applied to a gate of the transistor Q11. Further, the decode signals RF2T<1> to RF2T<7> are applied, in this order, to gates of the transistors Q11 of subsequent seven main word drivers MWD. Thus, one of the main word driver MWD for which all the decode signal groups RF7T, RF5T and RF2T are set to a high level is selectively activated.

Meanwhile, in the main switch driver MSD shown in FIG. 5B, there are provided seven transistors Q30 to Q36 in a portion of a three-stage inverter circuit, and three transistors Q40 to Q42 in a circuit portion at an input side. Among these, a circuit configuration of the transistors Q30 to Q36 of the three-stage inverter circuit is approximately common to that of the transistors Q10 to Q16 in the main word driver MWD of FIG. 5A. However, in FIG. 5B, the control signal RBT is applied to a gate of the transistor Q30, and the control signal RAT is applied to a gate of the transistor Q31. Further, an output node Nd of the last stage inverter of FIG. 5B is connected to the main switch control line MSL. In addition, high-voltage transistors are used as the transistors Q30 to Q36, and a description thereof will be omitted.

Further, a circuit portion of the transistors Q40 and Q41 at an input side of FIG. 5B are the same as the circuit portion of the transistors Q20 and Q21 at the input side of FIG. 5A, and connection relations of the decode signals RF7T<0>, RF5T<0> and the control signal RM1 are common between FIGS. 5A and 5B. However, in FIG. 5B, the transistor Q42 inserted between a node Ne and a line of the control signal RM1 is added in addition to the above circuit portion. The decode signal RFST<1> is applied to a gate of the transistor Q42. Thus, the main switch driver MSD of FIG. 5B is activated when not only the decode signal RF7T<0> is at the high level and the control signal RM1 is at the low level, but also at least one of the decode signals RF5T<0> and RFST<1> is at a low level.

In addition, high Vt transistors having a high threshold voltage are used as NMOS type transistors included in the main word driver MWD and the main switch driver MSD of FIGS. 5A and 5B. However, the ground potential VSS supplied to the main word driver MWD and the main switch driver MSD may be replaced with a negative potential VKK of a lower voltage level. In this case, transistors having a normal threshold voltage (for example, the same threshold voltage as the transistors Q20 and Q40) can be used as NMOS type transistors in the sub-word driver SWD and the local switch drivers LSD, which will be described in FIGS. 7A and 7B below.

In FIGS. 5A and 5B, when comparing circuit configurations of one main word driver MWD and one main switch driver MSD, the portion of the three-stage inverter circuit is common and there is a difference only in one transistor (the transistor Q42) in the circuit portion at the input side. Thus, when the main word drivers MWD and the main switch drivers MSD are aligned in a layout in the X decoder region, as shown in FIG. 4, each driver can be configured in an area of the same size and shape, and therefore it is possible to suppress both timing skew and an increase in layout area.

Figure 6:
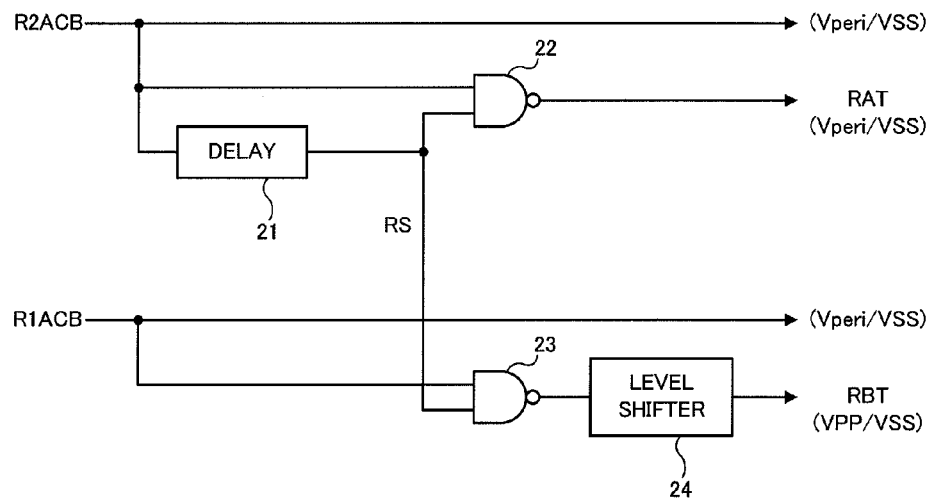
FIG. 6 is a diagram showing a configuration example of a control signal generation circuit generating control signals supplied to the main switch driver.

FIG. 6 show a configuration example of a control signal generation circuit 20 generating the control signals RAT and RBT supplied to the main switch driver MSD. The control signal generation circuit 20 shown in FIG. 6 includes a delay element 21, two NAND gates 22 and 23, and a level shifter 24. Control signals R1ACB and R2ACB specifying operation timings are supplied from a control circuit (not shown) to the control signal generation circuit 20. One control signal R1ACB is a control signal associated with a timing of a bit line precharge operation, and the other control signal R2ACB is a control signal associated with a timing of a word line selecting operation. A high level of the control signals R1ACB and R2ACB is a power supply voltage Vperi while a low level thereof is the ground potential VSS, and both the signals are activated when being set to the high level.

In FIG. 6, the delay element 21 receives the control signal R2ACB and outputs a reset signal RS obtained by delaying the control signal R2ACB by a predetermined delay time. One NAND gate 22 receives the control signal R2ACB and the reset signal RS and outputs a result of NAND operation as the control signal RAT. A high level of the control signal RAT is the power supply voltage Vperi, and a low level thereof is the ground potential VSS. The other NAND gate 23 receives the control signal R1ACB and the reset signal RS and outputs a result of NAND operation. The level shifter 24 shifts a level of an output signal of the NAND gate 23, and outputs it as the control signal RBT having a high level at the positive potential VPP and a low level at the ground potential VSS. Both the control signals RAT and RBT are activated when being set to the high level, and a timing of an activation period is determined depending on the delay time of the delay element 21.

Figure 7A:
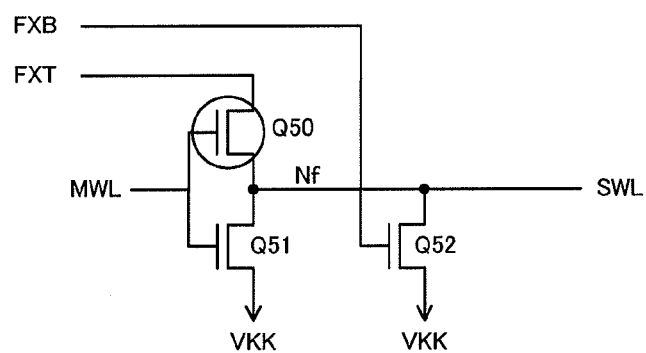
FIGS. 7A and 7B are diagrams showing circuit configurations of a sub-word driver and a local switch driver of the first embodiment.
Figure 7B:
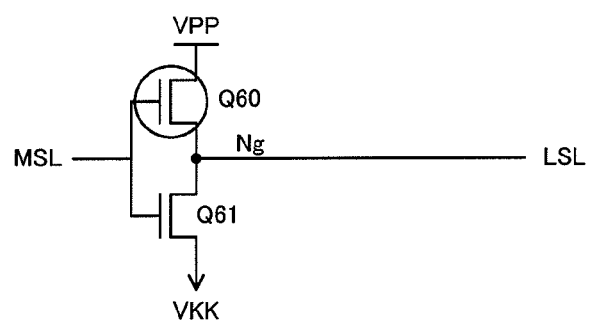

Next, configurations and operations of the sub-word driver SWD and the local switch driver LSD in FIG. 3 will be described. FIG. 7A shows a circuit configuration of the sub-word driver SWD, and FIG. 7B shows a circuit configuration of the local switch driver LSD. The sub-word driver SWD shown in FIG. 7A includes a PMOS type transistor Q50 as a high-voltage transistor and NMOS type transistors Q51 and Q52 each as a high-voltage transistor. A pair of transistors Q50 and Q51 that form an inverter are connected in series between a sub-word select line FXT and the negative potential VKK, and gates thereof are connected to the main word line MWL. Meanwhile, a node Nf between the transistors Q50 and Q51 is coupled to the sub-word line SWL. Further, the transistor Q52 is connected between the node Nf and the negative potential VKK, and a gate thereof is connected to a sub-word select line FXB. The sub-word driver SWD is activated when the sub-word select line FXT is at a high level and the sub-word select line FXB is at a low level. At this point, when the main word line MWL changes to a low level as a selected level, the sub-word line SWL at the output side is driven to a high level. Here, the transistors Q51 and 52 are high Vt transistors.

Meanwhile, the local switch driver LSD shown in FIG. 7B includes a PMOS type transistor Q60 as a high-voltage transistor and an NMOS type transistor Q61 as a high-voltage transistor. A pair of transistors Q60 and Q61 that form an inverter are connected in series between the positive potential VPP and the negative potential VKK, and gates thereof are connected to the main switch control line MSL. Further, a node Ng between the transistors Q60 and Q61 is coupled to the local switch control line LSL. In the local switch driver LSD, when the main switch control line MSL at the input side is driven to a low level as a selected level, the local switch control line LSL is driven to a high level, and the hierarchical switch SW corresponding to the local switch control line LSL is brought into a connected state. Here, the transistor Q61 is a high Vt transistor. From a viewpoint of preventing a through current, it is desirable to use high Vt transistors as NMOS type transistors included in the sub-word driver SWD and the local switch driver LSD of FIG. 7.

In FIGS. 7A and 7B, when comparing circuit configurations of the sub-word driver SWD and the local switch driver LSD, the portion of the inverter is common and there is a difference only in that the portion of the transistor Q52 of FIG. 7A corresponds to an empty area in FIG. 7B. Thus, when the sub-word drivers SWD and the local switch drivers LSD are aligned in a layout in the memory cell array AR, each of the local switch drivers LSD can be configured in an area of the same size and shape as the sub-word driver SWD, and therefore it is possible to suppress both timing skew and an increase in layout area.

Next, an operation of the memory cell array ARY of the first embodiment will be described with reference to FIG. 8.

Figure 8:
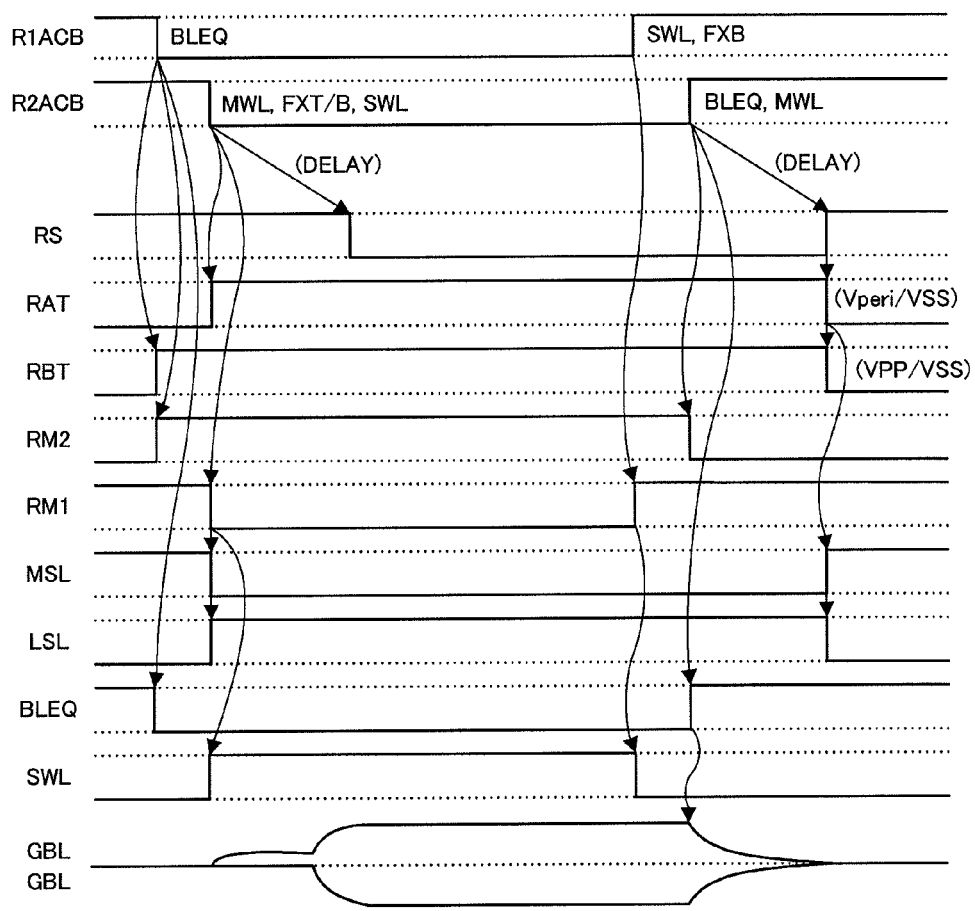
FIG. 8 is a diagram explaining an operation of a memory cell array of the first embodiment.

FIG. 8 shows operation waveforms at respective parts of the memory cell array ARY when reading out data of a selected memory cell MC by activating one sub-word line SWL corresponding to one main word line MWL. When an access period is stared at an early point of FIG. 8, the control signal R1ACB (FIG. 6) is activated from a high level to a low level. Thereby, the control signals RBT and RM2 are activated from a low level to a high level respectively, and a bit line equalizing signal BLEQ changes from a high level to a low level so as to cancel a bit line precharge operation. At this point, potentials of a pair of global bit lines GBL are maintained at a predetermined precharge potential by the precharge operation.

Subsequently, the control signal R2ACB (FIG. 6) is activated from a high level to a low level. Thereby, the control signal RAT is activated from a low level to a high level, and the control signal RM1 is activated from a high level to a low level. Further, since the selected main word driver MWD is activated by the control signal RM1 at the input side (FIG. 5A), a corresponding main switch control line MSL is driven to a low level, and a corresponding local switch control line LSL is driven to a high level. Further, a selected sub-word line SWL is driven to a high level. As a result, data read out from the selected memory cell MC is transmitted from the local bit line LBL to the global bit line GBL through the hierarchical switch SW. Thereafter, the potentials of the pair of global bit lines GBL are amplified by the sense amplifier SA, and change to high and low levels, respectively. Meanwhile, in the control signal generation circuit 20 of FIG. 6, a change of the control signal R2ACB is delayed by a predetermined time so as to change the reset signal RS from a high level to a low level.

Subsequently, when the access period of FIG. 8 is finished, the control signal R1ACB is returned to the high level. Thereby, the control signal RM1 is returned to the high level, and the potential of the sub-word line SWL at the high level is returned to the low level through the corresponding main word driver MWD and the sub-word driver SWD. Subsequently, the control signal R2ACB is returned to the high level. Thereby, the control signal RM2 is returned to the low level, and the bit line equalizing signal BLEQ changes to the high level again so that the bit line precharge operation is started. At this point, an amplification operation of the sense amplifier SA is finished, and the potentials of the pair of the global bit lines GBL converge to the predetermined precharge potential again.

Thereafter, in the control signal generation circuit 20 of FIG. 6, a change of the control signal R2ACB is delayed by a predetermined time so as to change the reset signal RS from the low level to the high level. Thereby, the control signals RAT and RBT are inactivated from the high level to the low level. At this point, the corresponding main word driver MWD is inactivated by the control signals RAT and RBT (FIG. 5B), the corresponding main switch control line MSL is returned to the high level and the corresponding local switch control line LSL is returned to the low level. Thereby, the operation of FIG. 8 completes. In this manner, an end point of the activation period of the hierarchical switch SW can be sufficiently delayed from a rising timing of the bit line equalizing signal BLEQ in the operation shown in FIG. 8. Thereby, it is possible to secure a time required for precharging the local bit line LBL from the global bit line GBL through the hierarchical switch SW by using the precharge circuit in the sense amplifier SA.

Second Embodiment

Figure 9:
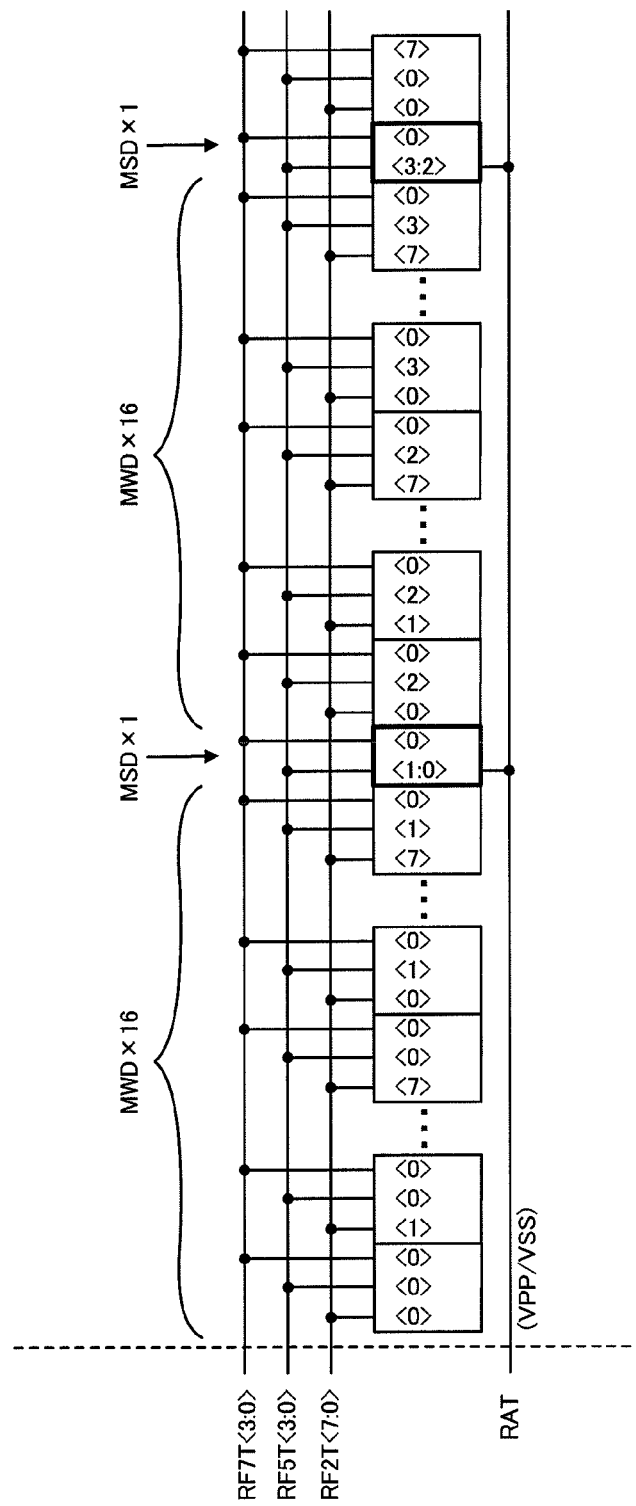
FIG. 9 is a block diagram schematically showing an arrangement of main word drivers and main switch drivers and a configuration of control lines in an X decoder region of a second embodiment.

A DRAM of a second embodiment will be described below. The DRAM of the second embodiment is common to the first embodiment in many respects, and thus different points from the first embodiment will be mainly described below. In the second embodiment, configurations of FIGS. 2, 3 and 7 are common to the first embodiment, so descriptions thereof will be omitted. FIG. 9 is a block diagram schematically showing an arrangement of the main word drivers MWD and the main switch drivers MSD and a configuration of control lines in the X decoder region of the second embodiment, which corresponds to FIG. 4 of the first embodiment. In FIG. 9, the lines of the decode signal groups RF7T, RF5T and RF2T and the line of the control signal RAT are configured in the same manner as in FIG. 4. In FIG. 9, there is a difference from FIG. 4 in that the line of the control signal RBT of FIG. 4 is not provided. That is, only the decode signal groups RF7T, RF5T and the control signal RAT are supplied to each main switch driver MSD of FIG. 5.

Figure 10:
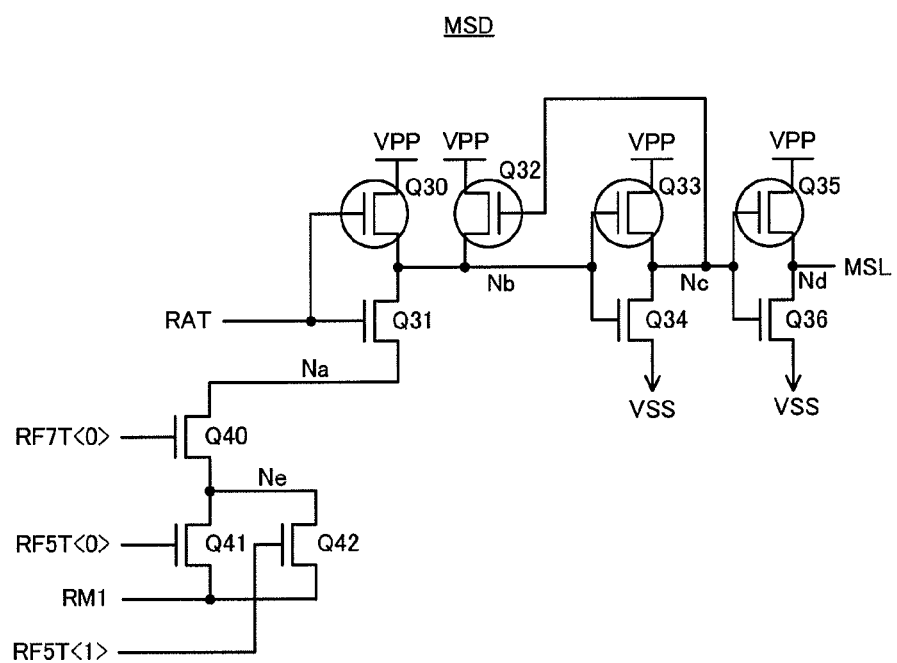
FIG. 10 is a block diagram showing a circuit configuration of a main switch driver of the second embodiment.

FIG. 10 shows a circuit configuration of the main switch driver MSD of the second embodiment. Here, the main word driver MWD has the same circuit configuration as in FIG. 5A of the first embodiment, so description thereof will be omitted. In FIG. 10, there is a difference from FIG. 5B of the first embodiment in that the control signal RAT is commonly applied to gates of a pair of transistors Q30 and Q31 of the first stage inverter. Other points are common to FIG. 5B.

Figure 11:
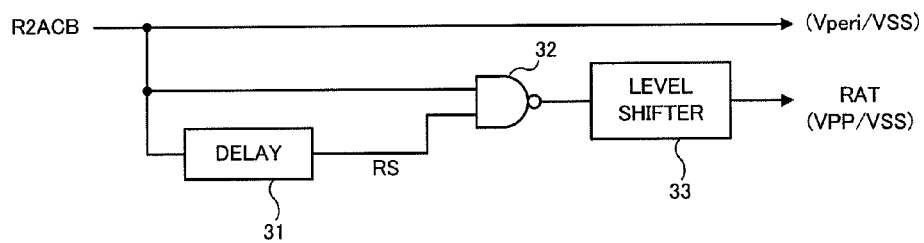
FIG. 11 is a diagram showing a configuration example of a control signal generation circuit generating a control signal supplied to the main switch driver of the second embodiment.

FIG. 11 show a configuration example of a control signal generation circuit 30 generating the control signal RAT supplied to the main switch driver MSD. The control signal generation circuit 30 shown in FIG. 11 includes a delay element 31, a NAND gate 32, and a level shifter 33. The control signal generation circuit 30 is supplied with the control signal R2ACB that is the same as in FIG. 6, and however is not supplied with the control signal R1ACB of FIG. 6. In FIG. 11, the delay element 31 and the NAND gate 32 are the same as the delay element 21 and the NAND gate 22 of FIG. 6. Further, the level shifter 33 shifts a level of an output signal of the NAND gate 32, and outputs it as the control signal RAT having a high level at the positive potential VPP and a low level at the ground potential VSS. In FIG. 11, an activation condition of the control signal RAT is the same as that in FIG. 6.

Figure 12:
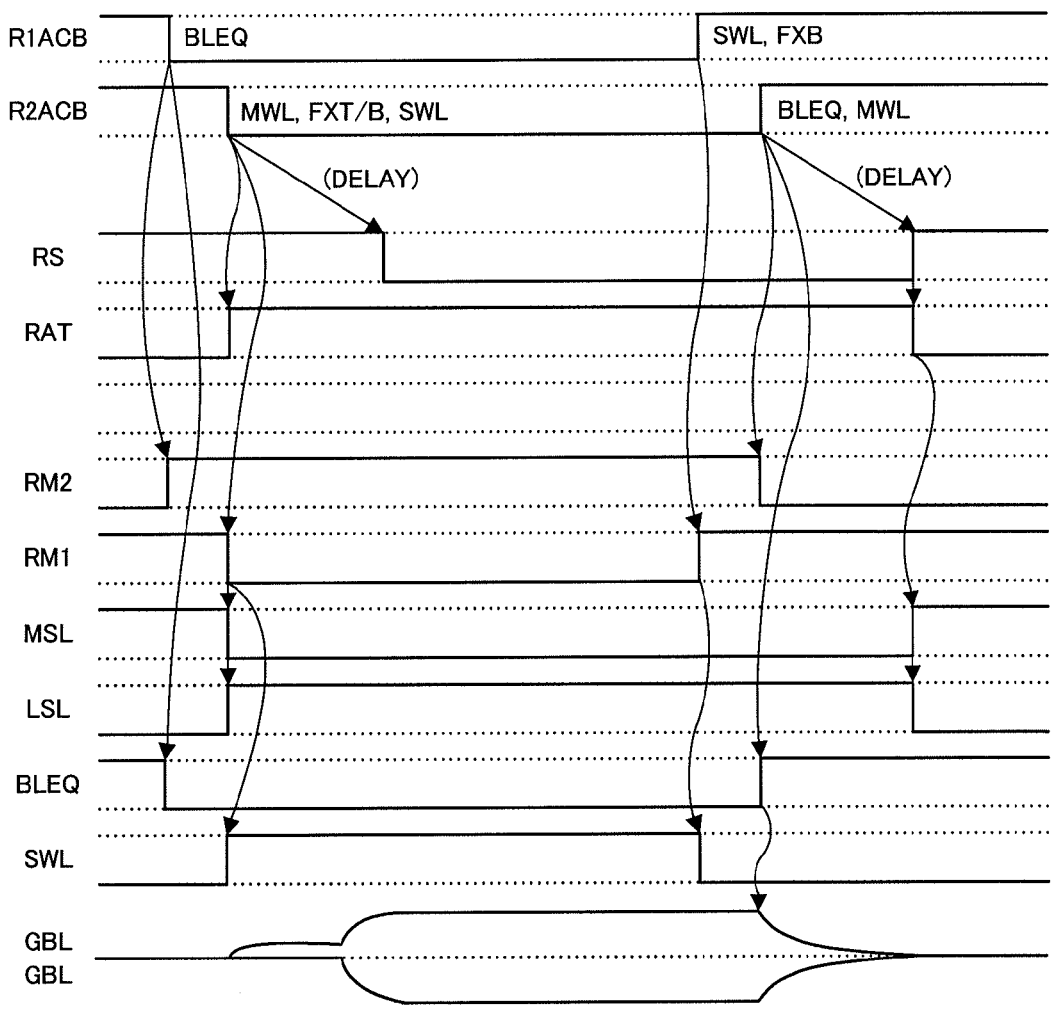
FIG. 12 is a diagram explaining an operation of a memory cell array of the second embodiment.

Next, an operation of the memory cell array ARY of the second embodiment will be described with reference to FIG. 12. FIG. 12 shows operation waveforms at respective parts of the memory cell array ARY in the same operation state in FIG. 8 of the first embodiment. In FIG. 12, there is a difference from FIG. 8 only in that the control signal RBT is not used. Other operation waveforms are common to those of FIG. 8, so description thereof will be omitted.

As described above, when employing the configuration of the second embodiment, it is possible to obtain an effect of preventing a decrease in access speed of the memory cell MC, similarly as in the first embodiment. In addition to this, by employing the configuration of the second embodiment, two lines (for the control signals RAT and RBT) connected to each main switch driver MSD in the X decoder region can be reduced to one line (for the control signal RAT) as shown in FIG. 9, and therefore a structure advantageous for reducing the chip area can be achieved.

According to the embodiments, in a memory cell array having a hierarchical bit line structure, hierarchical switches can be properly controlled in small-scale circuits without an increase in chip area, and it is possible to reliably prevent a decrease in access speed by controlling an operation of each hierarchical switch at a proper timing.

[Data Processing System]

Figure 13:
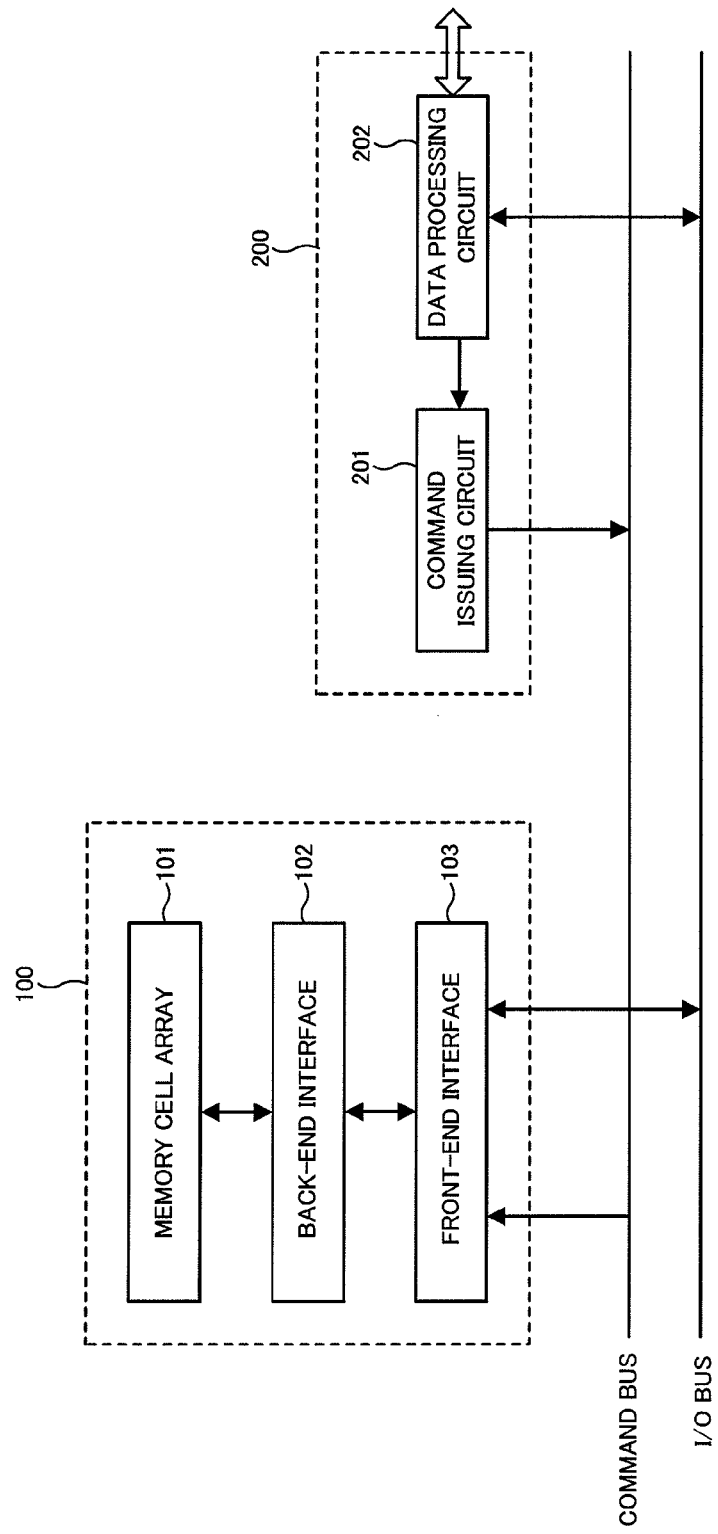
FIG. 13 is a diagram showing a configuration example of a data processing system comprising a semiconductor device having the configuration described in the embodiments and a controller controlling operations of the semiconductor device.

Next, a case in which the present invention is applied to a data processing system comprising a semiconductor device will be described. FIG. 13 shows a configuration example of the data processing system comprising a semiconductor device 100 having the configuration described in the embodiments and a controller 200 controlling operations of the semiconductor device 100.

The semiconductor device 100 is provided with a memory cell array 101, a back-end interface 102 and a front-end interface 103. The memory cell array 101 includes the memory cells MC of the above embodiments. The back-end interface 102 includes peripheral circuits of the memory cell array 101. The front-end interface 103 has a function to communicate with the controller 200 through a command bus and an I/O bus. Although FIG. 13 shows only one semiconductor device 100, a plurality of semiconductor devices 100 may be provided in the system.

The controller 200 is provided with a command issuing circuit 201 and a data processing circuit 202, and controls operations of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device 100 of the embodiments may be included in the controller 200 in FIG. 13.

The data processing system of FIG. 13 is, for example, a system implemented in electronics devices such as personal computers, communication electronics devices, mobile electronics devices and other industrial/consumer electronics devices.

The present invention described in the embodiments can be widely applied to semiconductor devices having the hierarchical bit line structure with volatile or nonvolatile memory cells. Further, various circuit configurations can be employed in circuits included in the semiconductor device of the invention without being limited to the circuit configurations disclosed in the embodiments. The memory cell array ARY may have a folded bit line structure. Further, a plurality of the local switch drivers LSD can be provided on one local bit line LBL. In this case, a plurality of corresponding hierarchical switches SW need to be arranged. Further, each hierarchical switches SW may be located at the center of the local bit line LBL. In this case, the corresponding local switch driver LSD is located between the plurality of sub-word drivers SWD in one sub-array SARY. The main switch driver MSD is the same, which is located between the plurality of main word drivers MWD. Further, in FIG. 3, two local switch control lines LSL extending in opposite directions may be connected to each local switch driver LSD. That is, the respective local switch control lines LSL may be alternately connected to the local switch drivers LSD adjacent on both sides in the Y direction (zigzag arrangement).

The invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the invention can be applied to various devices such as SOC (System on Chip), MCP (Multi Chip Package) and POP (Package on Package) and the like.

Further, transistors used in the embodiments are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the embodiments may include bipolar transistors. Furthermore, an N-channel type transistor (NMOS transistors) is a typical example of a first conductive type transistor, and a P-channel type transistor (PMOS transistor) is a typical example of a second conductive type transistor. Note that, in the embodiments, if the first conductive type transistor is replaced with the second conductive type transistor, the potential relation of control signals needs to be reversed in level.

The present invention can be applied to devices based on various combinations or selections of the disclosure of the embodiments. That is, the invention covers various modifications which those skilled in the art can carry out in accordance with all disclosures including claims and technical ideas.

The invention claimed is:

1. A semiconductor device comprising:
a plurality of first local bit lines;
a first global bit line corresponding to the first local bit lines, the first global bit line being longer in length than the first local bit lines;
a plurality first local switch control lines;
a plurality of main switch control lines corresponding to the first local switch control lines, the main switch control lines being respectively longer in length than the first local switch control lines;
a plurality of first hierarchical switches respectively controlling electrical connections between the first local bit lines and the first global bit line in response to potentials of the first local switch control lines;
a plurality of first local switch drivers respectively driving the first local switch control lines in response to potentials of the main switch control lines;
a plurality of main switch drivers respectively activating the main switch control lines selectively;
a plurality of second local bit lines;
a second global bit line corresponding to the second local bit lines, the second global bit line being longer in length than the second local bit lines;
a plurality of second local switch control lines being longer in length than the main switch control lines;
a plurality of second hierarchical switches respectively controlling electrical connections between the second local bit lines and the second global bit line in response to potentials of the second local switch control lines; and
a plurality of second local switch drivers respectively driving the second local switch control lines in response to the potentials of the main switch control lines.

2. The semiconductor device according to claim 1, further comprising:
a plurality of first and second memory cells respectively coupled to the first and second local bit lines;
a plurality of first and second sub-word lines respectively selecting the first and second memory cells;
a plurality of main word lines each corresponding to one of the first sub-word lines and one of the second sub-word lines commonly;
a plurality of first sub-word drivers selectively activating the first sub-word lines in response to potentials of the main word lines;
a plurality of second sub-word drivers selectively activating the second sub-word lines in response to the potentials of the main word lines; and
a plurality of main word drivers respectively activating the main word lines selectively.

3. The semiconductor device according to claim 2, further comprising a plurality of first and second sense amplifiers respectively amplifying signal voltages of the first and second global bit lines.

4. The semiconductor device according to claim 2,
wherein decode signals generated in accordance with an address are supplied to the main word drivers,
and the decode signals and one or more control signals specifying an operation timing are respectively supplied to the main switch drivers.

5. The semiconductor device according to claim 2, wherein each of the main word drivers and each of the main switch drivers are configured with a same number of stages of gates.

6. The semiconductor device according to claim 2,
wherein each of the first sub-word drivers and each of the first local switch drivers are configured with a same number of stages of gates,
and each of the second sub-word drivers and each of the second local switch drivers are configured with a same number of stages of gates.

7. The semiconductor device according to claim 6, wherein each of the first and second sub-word drivers and the first and second local switch drivers comprises an inverter circuit including complementary transistors.

8. The semiconductor device according to claim 1,
wherein the first and second global bit lines and the first and second local bit lines extend in a first direction,
and the first and second local switch control lines and the main switch control lines extend in a second direction intersecting the first direction.

9. The semiconductor device according to claim 2,
wherein the first and second global bit lines and the first and second local bit lines extend in a first direction,
and the first and second local switch control lines, the main switch control lines, the first and second sub-word lines and the main word lines extend in a second direction intersecting the first direction.

10. A data processing system comprising:
the semiconductor device according to claim 1; and
a controller controlling an operation of the semiconductor device, the controller connected to the semiconductor device through a bus.

11. A semiconductor device comprising:
a plurality of first local bit lines;
a first global bit line corresponding to the first local bit lines, the first global bit line being longer in length than the first local bit lines;
a plurality of first local switch control lines;
a plurality of main switch control lines corresponding to the first local switch control lines, the main switch control lines being respectively longer in length than the first local switch control lines;
a plurality of first hierarchical switches respectively controlling electrical connections between the first local bit lines and the first global bit line in response to potentials of the first local switch control lines;
a plurality of first local switch drivers respectively driving the first local switch control lines in response to potentials of the main switch control lines; and
a plurality of main switch drivers respectively activating the main switch control lines selectively,
wherein the first global bit line and the first local bit lines extend in a first direction,
and the first local switch control lines and the main switch control lines extend in a second direction intersecting the first direction.

12. A semiconductor device comprising:
a plurality of first local bit lines respectively coupled to a plurality of first memory cells, the first local bit lines respectively extending in a first direction;
a first global bit line corresponding to the first local bit lines, the first global bit line extending in the first direction;
a plurality of first local switch control lines extending in a second direction intersecting the first direction;
a plurality of main switch control lines corresponding to the first local switch control lines, the main switch control lines being respectively longer in length than the first local switch control lines and extending in the second direction;
a plurality of first hierarchical switches respectively controlling electrical connections between the first local bit lines and the first global bit line in response to potentials of the first local switch control lines;
a plurality of first local switch drivers respectively driving the first local switch control lines in response to potentials of the main switch control lines;
a plurality of main switch drivers respectively activating the main switch control lines selectively;
a plurality of first sub-word lines respectively selecting the first memory cells, the first sub-word lines extending in the second direction;
a plurality of main word lines corresponding to the first sub-word lines, the main word lines extending in the second direction;
a plurality of first sub-word drivers selectively activating the first sub-word lines in response to potentials of the main word lines; and
a plurality of main word drivers respectively activating the main word lines selectively.

13. The semiconductor device according to claim 12, wherein the main word drivers and the main switch drivers are aligned in the first direction.

14. The semiconductor device according to claim 13, wherein a first number of main word drivers among the plurality of main word drivers and one main switch driver among the plurality of main switch drivers form one set of main drivers, and a plurality of sets each being the set of main drivers are aligned in the first direction.

15. The semiconductor device according to claim 13,
wherein lines of decode signals generated in accordance with an address extend in the first direction, the decode signals being supplied to the main word drivers and the main switch drivers,
and lines of one or more control signals specifying an operation timing extend in the first direction.

16. The semiconductor device according to claim 12, wherein the first sub-word drivers and the first local switch drivers are aligned in the first direction.

17. The semiconductor device according to claim 16, wherein a first number of sub-word drivers among the plurality of sub-word drivers and one first local switch driver among the plurality of first local switch drivers form one set of sub-drivers, and a plurality of sets each being the set of sub-drivers are aligned in the first direction.

18. A semiconductor device comprising:
first and second local bit lines;
first and second global bit lines respectively corresponding to the first and second local bit lines, the first and second global bit lines being longer in length than the first and second local bit lines respectively;
first and second local switch control lines;
a main switch control line corresponding to the first and second local switch control lines, the main switch control line being longer in length than the first and second local switch control lines;
first and second hierarchical switches respectively controlling electrical connections between the first and second local bit lines and the first and second global bit lines in response to potentials of the first and second local switch control lines;
first and second local switch drivers respectively driving the first and second local switch control lines in response to a potential of the main switch control line; and
a main switch driver activating the main switch control line.

19. The semiconductor device according to claim 18, further comprising:
a plurality of first and second memory cells respectively coupled to the first and second local bit lines;
a plurality of first and second sub-word lines respectively selecting the first and second memory cells;
a plurality of main word lines each corresponding to one of the first sub-word lines and one of the second sub-word lines commonly;
a plurality of first sub-word drivers selectively activating the first sub-word lines in response to potentials of the main word lines;
a plurality of second sub-word drivers selectively activating the second sub-word lines in response to the potentials of the main word lines; and
a plurality of main word drivers respectively activating the main word lines selectively.

20. The semiconductor device according to claim 19, further comprising a plurality of first and second sense amplifiers respectively amplifying signal voltages of the first and second global bit lines.

21. The semiconductor device according to claim 19,
wherein decode signals generated in accordance with an address are supplied to the main word drivers,
and the decode signals and one or more control signals specifying an operation timing are respectively supplied to the main switch driver.

22. The semiconductor device according to claim 19, wherein each of the main word drivers and the main switch driver are configured with a same number of stages of gates.

23. The semiconductor device according to claim 19,
wherein each of the first sub-word drivers and the first local switch driver are configured with a same number of stages of gates,
and each of the second sub-word drivers and the second local switch driver are configured with a same number of stages of gates.

24. The semiconductor device according to claim 23, wherein each of the first and second sub-word drivers and the first and second local switch drivers comprises an inverter circuit including complementary transistors.

25. The semiconductor device according to claim 18,
wherein the first and second global bit lines and the first and second local bit lines extend in a first direction,
and the first and second local switch control lines and the main switch control line extend in a second direction intersecting the first direction.

26. The semiconductor device according to claim 19,
wherein the first and second global bit lines and the first and second local bit lines extend in a first direction,
and the first and second local switch control lines, the main switch control line, the first and second sub-word lines and the main word lines extend in a second direction intersecting the first direction.

27. The semiconductor device according to claim 18, further comprising first and second sense amplifiers respectively amplifying signal voltages of the first and second global bit lines.

* * * * *